United States Patent
Ellis et al.

(10) Patent No.: US 8,942,056 B2
(45) Date of Patent: Jan. 27, 2015

(54) PROTOCOL FOR MEMORY POWER-MODE CONTROL

(75) Inventors: Wayne F. Ellis, Saratoga, CA (US); Wayne S. Richardson, Saratoga, CA (US); Akash Bansal, Santa Clara, CA (US); Frederick A. Ware, Los Altos Hills, CA (US); Lawrence Lai, San Jose, CA (US); Kishore Ven Kasamsetty, Cupertino, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/980,826

(22) PCT Filed: Feb. 15, 2012

(86) PCT No.: PCT/US2012/025310
§ 371 (c)(1),
(2), (4) Date: Jul. 19, 2013

(87) PCT Pub. No.: WO2012/115839
PCT Pub. Date: Aug. 30, 2012

(65) Prior Publication Data
US 2013/0305074 A1    Nov. 14, 2013

Related U.S. Application Data

(60) Provisional application No. 61/445,947, filed on Feb. 23, 2011.

(51) Int. Cl.
*G11C 5/14* (2006.01)
*G06F 1/32* (2006.01)
*G11C 7/02* (2006.01)
*G11C 7/20* (2006.01)
(Continued)

(52) U.S. Cl.
CPC ............... *G06F 1/3234* (2013.01); *G11C 7/02* (2013.01); *G11C 7/20* (2013.01); *G11C 11/40615* (2013.01); *G11C 11/4072* (2013.01); *G11C 29/022* (2013.01); *G11C 29/028* (2013.01)
USPC .............. 365/227; 365/226; 365/189.03

(58) Field of Classification Search
CPC ........................................... G06F 1/3234
USPC ...................... 365/226, 227, 189.03
See application file for complete search history.

(56) References Cited

U.S. PATENT DOCUMENTS 5,828,592 A * 10/1998 Tran et al. ............... 365/45
6,166,990 A * 12/2000 Ooishi et al. ........ 365/233.11
(Continued)

OTHER PUBLICATIONS

PCT International Search Report and Written Opinion, PCT/US2012/025310, May 25, 2012, 16 Pages.

*Primary Examiner* — Viet Q Nguyen
(74) *Attorney, Agent, or Firm* — Fenwick & West LLP

(57) ABSTRACT

In one embodiment, a memory device includes a memory core and input receivers to receive commands and data. The memory device also includes a register to store a value that indicates whether a subset of the input receivers are powered down in response to a control signal. A memory controller transmits commands and data to the memory device. The memory controller also transmits the value to indicate whether a subset of the input receivers of the memory device are powered down in response to the control signal. In addition, in response to a self-fresh command, the memory device defers entry into a self-refresh operation until receipt of the control signal that is received after receiving the self-refresh command.

13 Claims, 5 Drawing Sheets

(51) Int. Cl.
*G11C 11/406* (2006.01)
*G11C 11/4072* (2006.01)
*G11C 29/02* (2006.01)

(56) References Cited

U.S. PATENT DOCUMENTS

| | | |
|---|---|---|
| 6,263,448 B1 | 7/2001 | Tsern et al. |
| 6,701,446 B2 | 3/2004 | Tsern et al. |
| 6,755,687 B1 | 6/2004 | Koo et al. |
| 6,879,540 B2 * | 4/2005 | Maruyama et al. ...... 365/189.03 |
| 7,177,208 B2 * | 2/2007 | Smith et al. .................. 365/194 |
| 7,248,528 B2 * | 7/2007 | Riho et al. ..................... 365/222 |
| 7,320,082 B2 | 1/2008 | Tsern et al. |
| 7,472,220 B2 | 12/2008 | Rajan et al. |
| 7,613,064 B1 | 11/2009 | Wagner et al. |
| 7,688,666 B2 | 3/2010 | Choi et al. |
| 8,238,175 B2 * | 8/2012 | Fujisawa ...................... 365/193 |
| 2009/0268542 A1 | 10/2009 | Noda |
| 2010/0238750 A1 | 9/2010 | Ito et al. |
| 2010/0278000 A1 | 11/2010 | Bhakta et al. |
| 2010/0293326 A1 | 11/2010 | Sewall et al. |
| 2013/0148447 A1 * | 6/2013 | Shaeffer et al. .......... 365/189.17 |
| 2013/0234766 A1 * | 9/2013 | Chang et al. .................. 327/142 |

\* cited by examiner

PROTOCOL FOR MEMORY POWER-MODE CONTROL

TECHNICAL FIELD

The present disclosure general relates to apparatus, protocols, and techniques for providing power management in systems that include (integrated circuit) memory controller and memory devices.

BACKGROUND

As mobile devices continue to offer increasing processing power and data transfer rates, battery life has become an important performance metric. Meanwhile, manufacturers strive to make mobile devices thinner and smaller. Since the power reserve available in many mobile devices is limited by the energy density and size of its battery, power-management features of the underlying hardware can be useful improvements to system blocks in order to increase the overall power efficiency of the mobile device.

DETAILED DESCRIPTION

Embodiments of the present disclosure provide for various protocols and apparatus for memory device power management. In an embodiment, a memory system, memory devices, and controllers that control such memory devices in the system allow a portion of a high-speed interface (HSI) of the memory device to be powered down. For example, a register is used to store a value indicating the portion of the HSI to be powered down, and a power-mode signal is used to power down the corresponding HSI portion. The operational state of the memory core is controlled separately by a command carried on the command/address (CA) portion and/or the data portion of the HSI. This way, the HSI can be powered up from a power-down mode for calibration while the memory core remains in an operational state with low power consumption.

Figure 1:
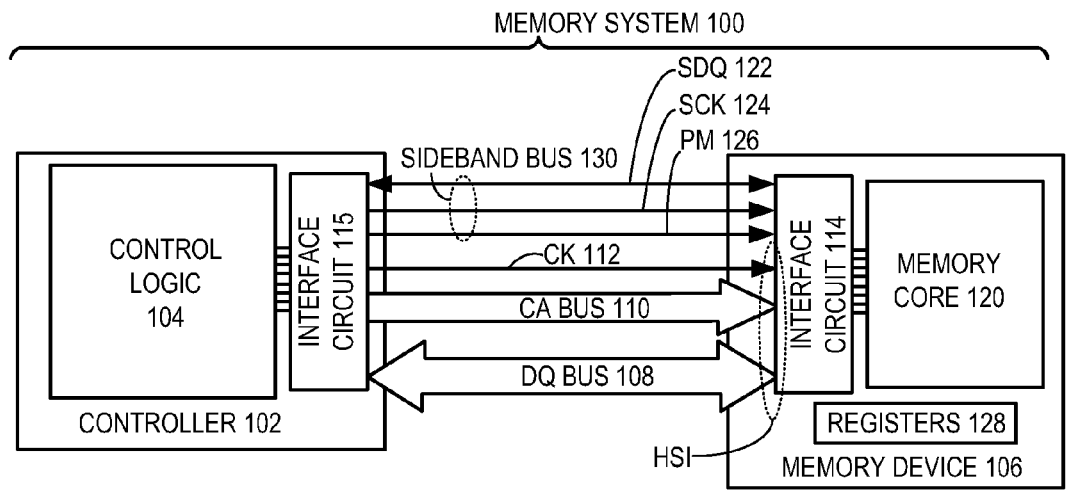
FIG. 1 illustrates components in an exemplary memory system that facilitates separate control of power modes for a high-speed interface (HSI) of the memory component and operational states of the memory core, in accordance with one embodiment.

FIG. 1 illustrates components in an exemplary memory system that facilitates separate control of power modes for a high-speed interface of the memory component and operational states of the memory core, in accordance with one embodiment. In this example, a memory system 100 includes a memory controller 102 and a memory device 106. Memory device 106 includes a memory core 120, an interface circuit 114, and a number of registers 128. Memory controller 102 includes an interface circuit 115 and a control logic 104, which controls the power modes of interface circuit 114 and the operational state of memory device 106, as described below. In one embodiment, memory controller 102 can communicate with memory device 106 via interface circuits 115 and 114. Interface circuits 115 and 114 are coupled to a clock (CK) signal line 112, a CA bus 110, and a DQ bus 108. During normal operation, the part of interface circuit 114 which is coupled to CK signal line 112, CA bus 110, and DQ bus 108 can operate at a high data rate and, in an embodiment, accommodate very low-swing differential (VLSD) signals. In the following description, this part of interface circuit 114 is referred to as the high-speed interface (HSI). Also coupled to memory device 106 is a sideband bus 130, which includes an interface-power-mode (PM) signal line 126, a sideband clock (SCK) signal line 124, and a sideband data (SDQ) bus 122.

Although in FIG. 1 interface circuit 114 is shown as a single block, in reality each signal line can couple to an interface on memory device 106. In other words, each signal line can be considered as being coupled to a separate interface. Furthermore, CA bus 110 can be considered as being coupled to a unidirectional command/address interface (since CA bus 110 is typically used to transmit bits from memory controller 102 to memory device 106). FIG. 1 illustrates CA bus 110 with a single arrow; however, addresses and commands can be conveyed over separate signal lines or be multiplexed over the same or subsets of signal lines. DQ bus 108 can be considered as being coupled to a bi-directional interface for data transmission in both directions (which can also be two separate unidirectional read/write data interfaces). These interfaces may have same or different data rates. In one embodiment, during a specific power-down mode, a subset of the HSI transmitters and receivers can be powered down while the rest can remain powered up. Alternatively, all of the HSI transmitters and receivers can be powered down. Memory device 106 can provide this option to selectively power down portion(s) of interface circuit 114 as specified by values stored in a mode register, which can be one of the registers 128. In a further embodiment, the different states of powering-down can be encoded in a power-down command. For example, a default command can be "power down all" (PDNALL) which powers down all portions of the HSI coupled to both CA bus 110 and DQ bus 108, and a "power down DQ" (PDNDQ) command can specify only powering down the HSI portion coupled to DQ bus 108. Note that the transmitters and receivers associated with sideband bus 130 can remain powered up when the HSI is powered down.

During operation, the level of PM signal 126, combined with the value of the mode register, determines the power mode for the HSI. In general, the HSI has at least two power modes: a power-up mode and a power-down mode. The power-up mode can correspond to several active states of the memory devices, such as idle (wherein the device is precharged), active (wherein a row has been activated), and active refresh (wherein a single row is being refreshed). In the power-up mode, all the transmitters and receivers coupled to the HSI on both controller 102 and memory device 106 are powered up. That is, the transmitters and receivers associated with DQ bus 108, CA bus 110, and CK bus 112 are all powered up. In the power-down mode, the transmitters and receivers associated with different buses can be selectively powered down. For example, when the mode register is set to a certain value, only the transmitters and receivers associated with DQ bus 108 are powered down in response to a transition in the level of the PM signal 126, whereas the transmitters and receivers associated with CA bus 110 remain powered up. Alternatively, when the mode register is set to a different value, all the transmitters and receivers associated with the HSI, as well as the corresponding transmitters and receivers in controller 102, are powered down in response to a transition in the level of the PM signal 126.

Various methods can be used to power down a transmitter or receiver. For example, a receiver or transmitter can have a current source which can be enabled or disabled (i.e., turned off) based on the power mode. In addition, the transmitter/receiver power for each individual interface (i.e., the interface corresponding to a given signal line or bus) can be controlled separately. The internal clocking to a particular interface can be gated such that no clocking of the circuits in that interface occurs when the interface is powered down.

In one embodiment, a high level on PM signal 126 indicates a normal operation (power-up) mode, and a low level indicates a power-down mode for the HSI. A transitional edge of PM signal 126 triggers memory device 106 to power down all or a subset of the transmitters and receivers associated with the HSI, depending on the value stored in the mode register. Correspondingly, memory controller 102 also turns off the associated transmitters and receivers. Alternatively, memory controller 102 can keep its transmitters and receiver powered on if the high-speed signal lines are coupled to more than one memory device, so that memory controller 102 can communicate with other memory devices when one memory device has its HSI powered down. Because the transition of PM signal 126 can occur very quickly, the HSI can be placed in the power-down mode with very little latency.

PM signal 126 does not affect the operational state of memory core 120. The operational state of memory core 120 is controlled by a command carried on CA bus 110 and/or DQ bus 108. For example, a self-refresh command can be transmitted by controller 102 on CA bus 110 to place memory core 106 in a self-refresh mode, before the HSI is put into the power-down mode. Other commands can be used to place memory core 106 in various states, such as idle standby and active standby. Such commands can be stored in registers and be used at a later time to set or control the operational state of memory core 120. This configuration facilitates separate control of the power modes for the HSI and operational states for memory core 106. As a result, memory core 120 and the HSI can be turned "on" or "off" without affecting each other's power state. When the HSI is in the power-down mode, memory core 120 is typically placed in an operational state with low power consumption. On the other hand, in certain situations, for example when the HSI needs to be calibrated, the HSI can be placed in a power-up mode (which can be triggered by a rising edge of PM signal 126), while memory core 120 remains in the low-power-consumption operational state. When memory core 120 is to exit the low-power-consumption operational state, the HSI is typically powered up first, and a command is then transmitted via the HSI to wake up memory core 120.

In one embodiment, memory controller 102 calibrates a set of parameters associated with the transmitters and receivers of the HSI to optimize data transmission. The calibration operations can be performed on a periodic basis to accommodate changes in conditions such as voltage and temperature fluctuation. To calibrate the HSI, controller 102 can transmit test patterns on one or more signal lines coupled to the memory device via the HSI and receive results of sampled test pattern from the memory device over the HSI.

Parameters of the HSI may be adjusted and/or updated during the calibration process and stored in registers. The calibration parameters can include timing parameters, such as receiver sample phase and transmitter drive phase, voltage parameters, such as receiver offset or reference voltage, receiver current bias, receiver termination impedance, transmit supply voltage, transmit drive swing voltage, and transmit termination impedance.

The receiver sample phase is a parameter that affects the temporal position of a received signal relative to a timing reference. Transmitter drive phase is a parameter that affects the temporal position of a transmitted signal relative to a timing reference. Receiver offset is a parameter that adjusts the voltage level of a received signal. Receiver reference voltage is an offset that adjusts a receiver reference voltage. Receiver current bias is a parameter that adjusts the bias voltage and a current source for a receiver circuit. Receiver termination impedance is a parameter that affects the impedance of a transmission line termination for a receiver circuit. Transmit supply voltage is a parameter that affects the supply voltage for a driver used to transmit a signal. Transmit drive swing voltage is a parameter that affects the voltage swing of a transmitted signal by a transmitter. Transmit termination impedance is a parameter that affects the impedance of a transmission line termination on the transmitter (or driver) circuit used to transmit a signal or the impedance of the transmitter.

In some embodiments, SCK line 124 and SDQ bus 122 can remain functional when the HSI is in the low-power mode and/or when memory core 120 is in the low-power-consumption operational state. SCK signal 124 is typically at a frequency much lower than that of CK 112. Hence, sideband bus 130 can remain operational at all times without being calibrated. In addition, SDQ bus 122 can be used to transfer data to and from registers 128, even when memory core 120 is in a low-power-consumption operational state. This feature provides an alternative way to access registers 128 without using the HSI.

Figure 2:
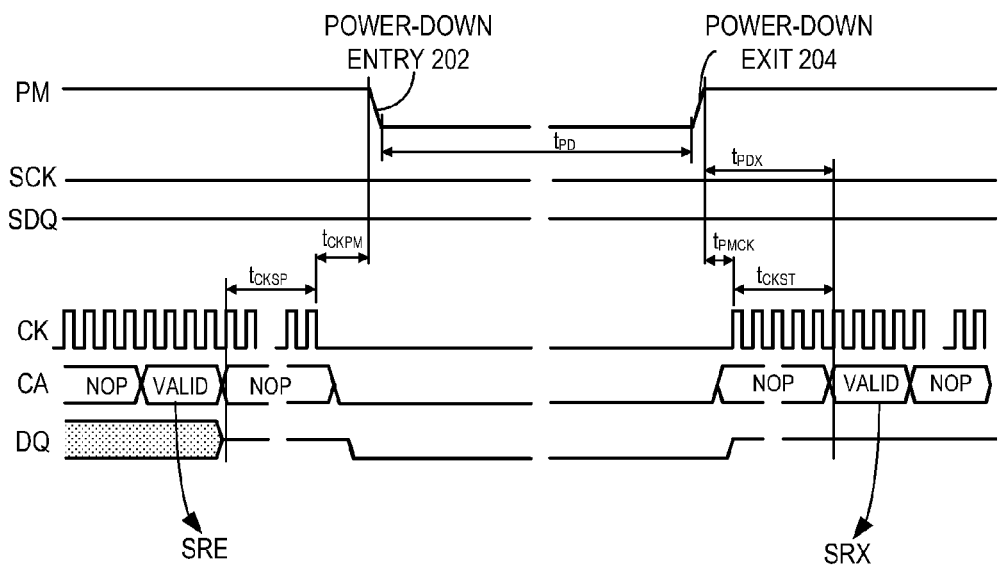
FIG. 2 presents an exemplary timing diagram illustrating the separate control of power modes for the HSI and operational states of the memory core, in accordance with one embodiment.

FIG. 2 presents an exemplary timing diagram illustrating the separate control of power mode for the high-speed interface and operational state for the memory core, in accordance with one embodiment. In this example, the PM signal exhibits two transitions: a power-down entry 202 and a power-down exit 204. The memory controller changes the PM signal from a high level to a low level to place the HSI in a power-down mode. Transmission on the DQ bus, CA bus, and CK signal line is typically terminated before the PM signal transitions to the low level. This practice ensures that active bus transmissions are complete before the PM signal changes. As illustrated in FIG. 2, the transmission on the DQ bus and transmission of valid commands on the CA bus are completed prior to the termination of the CK signal (by $t_{CKSP}$ as illustrated in FIG. 2). The falling edge of the PM signal can occur at $t_{CKPM}$ after the termination of the CK signal.

After power-down entry 202, the HSI remains in a power-down state for a duration of $t_{PD}$. However, the transition of the PM signal does not affect the power state of the memory core. In general, the memory core can be placed in a low-power self-refresh state by a command carried on the CA bus when valid commands are allowed before the HSI enters the power-down mode. For example, as illustrated in FIG. 2, a self-refresh entry (SRE) command can be placed on the CA bus to place the memory core in a low-power self-refresh mode. The memory core can also stay in a normal operational state while the HSI is in the power-down mode.

A rising edge of the PM signal triggers the power-down exit 204. After HSI exits the power-down mode, transmission on the HSI is resumed. Typically, to reduce the interference of voltage fluctuation and to minimize transmission errors, transmission on the HSI is slightly delayed following the rising edge of the PM signal. In this example, transmission of the CK signal is resumed at $t_{PMCK}$ after power-down exit 204. Transmission of valid commands on the CA bus is allowed at $t_{PDX}$ after power-down exit 204. A self-fresh exit (SRX) command placed on the CA bus can bring the memory core out of the low-power self-refresh mode to resume normal operation.

One advantage of having separate control of the power modes for the HSI and operational states for the memory core is that it allows the HSI to be periodically woken up for receiver calibration (such that the HSI remains locked with the clock in the memory controller) without waking up the core. This feature saves both power and time. In conventional systems where the power modes of the HSI and operational states of the memory core are jointly controlled, each time the HSI receivers need calibration, the memory core has to exit the low-power-consumption state. It could take the memory core hundreds of nano seconds to exit the low-power-consumption state, while it only takes the HSI tens of nano seconds to exit the power-down mode for calibration. Hence, periodic calibration of HSI receivers in conventional systems can be both energy-inefficient and time-consuming.

Figure 3:
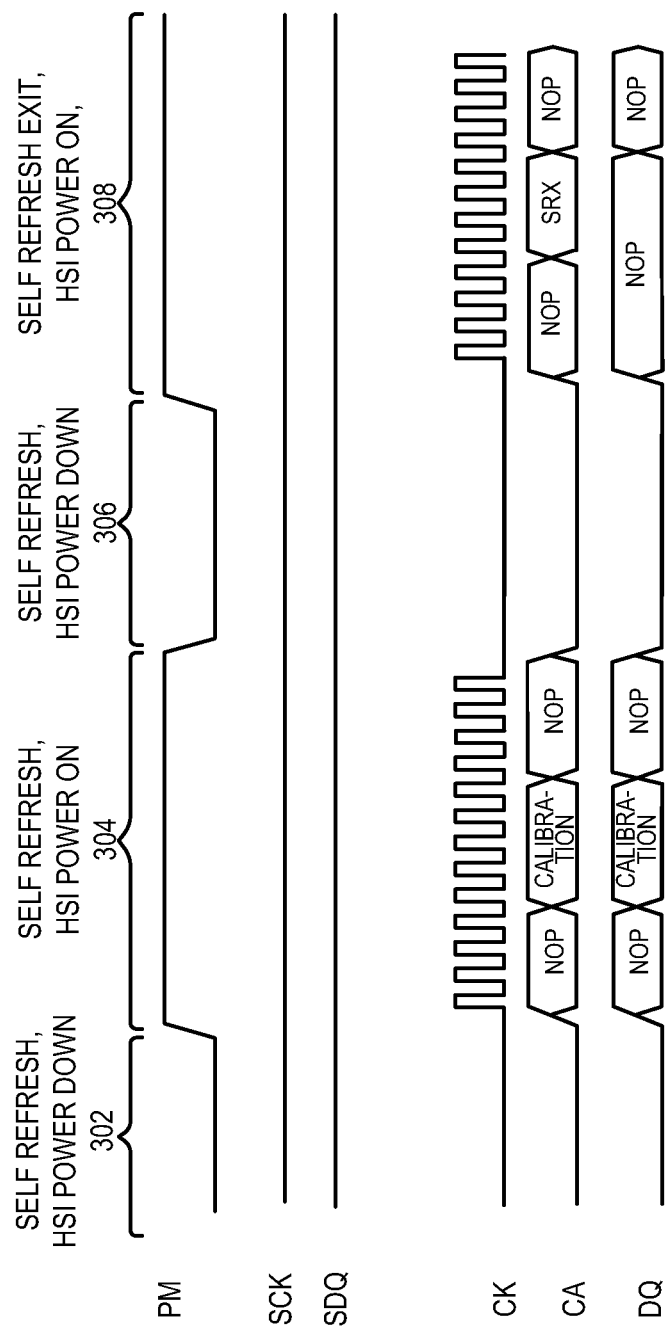
FIG. 3 presents an exemplary timing diagram illustrating the process of calibrating the receivers on the HSI without requiring the memory core to exit its self-refresh mode, in accordance with one embodiment.

The present system solves this problem, because the PM signal can wake up the HSI without waking up the memory core. FIG. 3 presents an exemplary timing diagram illustrating the process of calibrating receivers on the high-speed interface without requiring the memory core to exit its self-refresh mode, in accordance with one embodiment. Starting from the left side of FIG. 3, assume that the memory core is in a self-refresh mode and the HSI is in a power-down mode (period 302). Subsequently, when the receivers on HSI need to be calibrated in period 304, the PM signal transitions to a high level, allowing the HSI to exit the power-down mode. The memory controller then begins transmitting the CK signal and calibration bit sequence on both CA and DQ buses. During period 304, the memory core remains in the low-power self-refresh state.

After the HSI calibration is complete, the PM signal transitions to a low level so that the HSI can be placed back in the power-down mode during period 306. The memory core also remains in the self-refresh state. At the beginning of period 308, the PM signal transitions to the high level to power up the HSI. After the HSI is stabilized and functional, the memory controller transmits an SRX command via the CA bus to instruct the memory core to exit the self-refresh state and return to normal operation.

Although the example in FIG. 3 illustrates only one calibration operation (period 304), the memory system can perform recurring HSI calibration in a similar way for an extended period. The energy and time savings resulting from not having to wake up the memory core can be significant.

Figure 4:
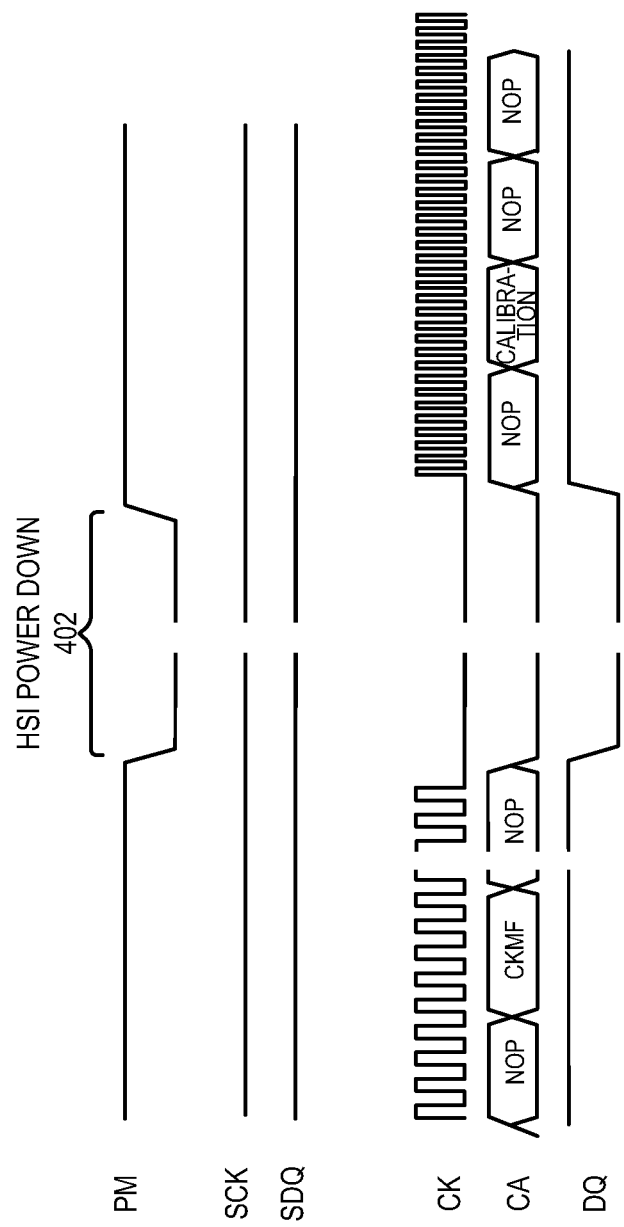
FIG. 4 presents an exemplary timing diagram illustrating how the clock frequency can be controlled by a command carried on the CA bus upon the HSI exiting a power-down mode, in accordance with one embodiment.

Since the CA bus can carry various commands to control the power state of the memory core, it is possible to change the operational state (e.g., operating frequency) of the HSI upon it exiting the power-down mode. FIG. 4 presents an exemplary timing diagram illustrating how the clock frequency can be controlled by a command carried on the CA bus upon the high-speed interface exiting a power-down mode, in accordance with one embodiment. In this example, prior to the HSI entering a power-down period 402, the memory controller issues a clock-modify-frequency (CKMF) command on the CA bus. This CKMF command sets all the necessary parameters corresponding to the subsequent frequency. Such parameters can include operating voltages, Row Address to Column Address Delay (tRCD, measured in clock cycles), access time for read data (tAC, measured in clock cycles). This information can be stored in the registers within the memory core.

After the HSI power-down period 402, the memory controller changes the PM signal to a high level to bring the HSI back to the normal power mode. Correspondingly, the CK signal is transmitted at a different frequency. Before the CA bus and DQ bus can be used to transmit bits at the new frequency, a calibration bit sequence is placed on these buses so that their receivers can be calibrated based on the new clock signal.

In the example in FIG. 4 the PM signal can be used as a way to trigger frequency change on the HSI. That is, the PM signal can be used to temporarily "turn off" the HSI in preparation for a frequency change. During the HSI power-down period 402, the memory core may remain in a regular-power-consumption state. In some embodiments, the memory core can also be placed in a low-power-consumption state when the HSI is powered down. In such cases, the memory controller can issue an SRE command after the CKMF command to place the memory core in the low-power-consumption state, and an SRX command after the calibration bit sequence to bring the memory core back to the regular-power-consumption state.

Figure 5:
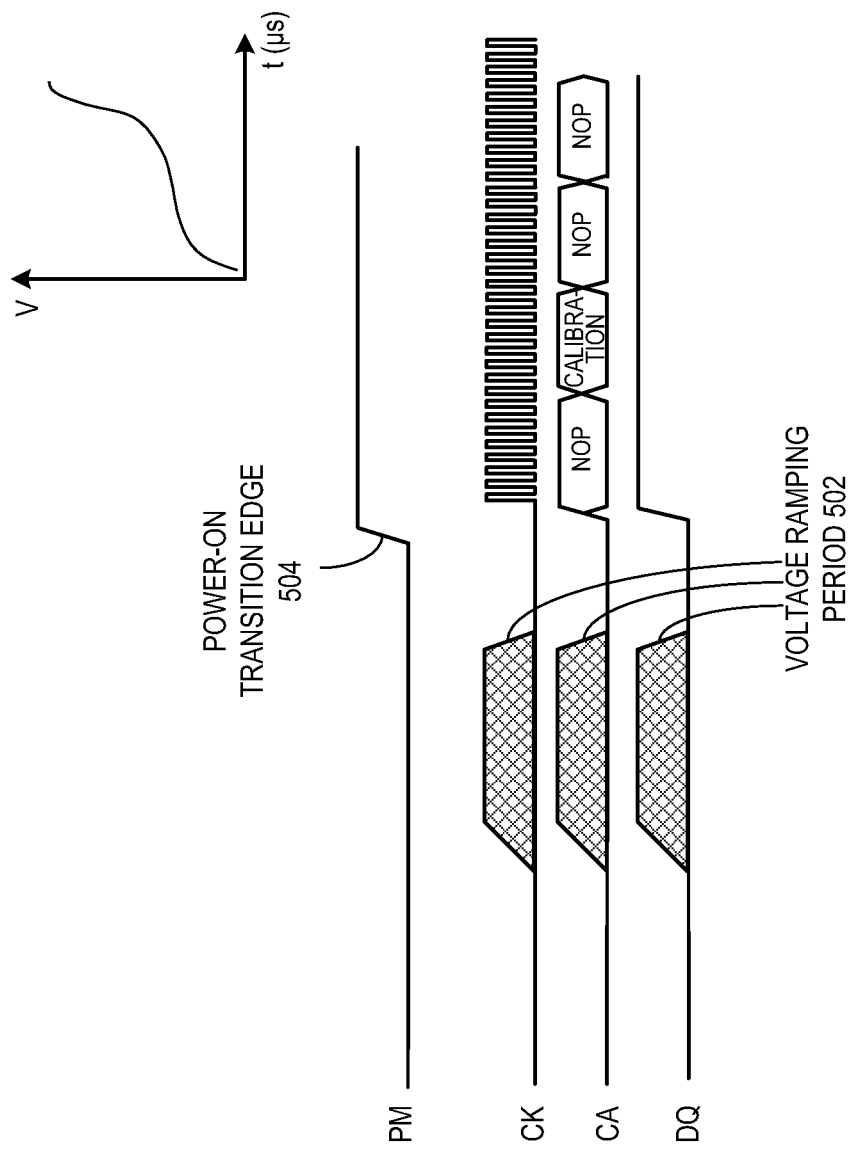
FIG. 5 presents an exemplary timing diagram illustrating how to avoid voltage-ramping interference upon the HSI exiting a power-down mode, in accordance with one embodiment.

During the initial power-up of the memory device, the voltage ramp-up can exhibit non-uniformities, as illustrated in the upper right corner of FIG. 5. This voltage ramping period could take micro seconds. To avoid interferences from this transition, the memory controller can ramp up the voltage for its transmitter and receiver before setting the PM signal to a high level. This way, the voltage is ramped up when the receivers on the memory-core side are still in the power-down mode, and will have stabilized when the HSI is powered on by a rising edge of the PM signal.

As illustrated in the example in FIG. 5, the memory controller can ramp up the voltage for the HSI during a voltage ramping period 502. At the same time, the PM signal remains at a low level. After the voltage has stabilized, the memory controller changes the PM signal to a high level to produce a power-on transition edge 504, which turns on all the receivers for the HSI. Subsequently, transmission on the CK line, CA bus, and DQ bus can be resumed.

In some embodiments, the sideband bus can be used to transfer data to and from the memory core regardless of the power state of the HSI and memory core. Referring back to FIG. 1, the SCK signal line 124 can carry a clock signal at a lower frequency than that of the HSI, hence obviating the need for the sideband bus to be calibrated. SDQ bus 122 can be used to transfer data to and from registers 128. SCK signal line 124 and SDQ 122 can remain operational even when the HSI is in the power-down mode.

Figure 6:
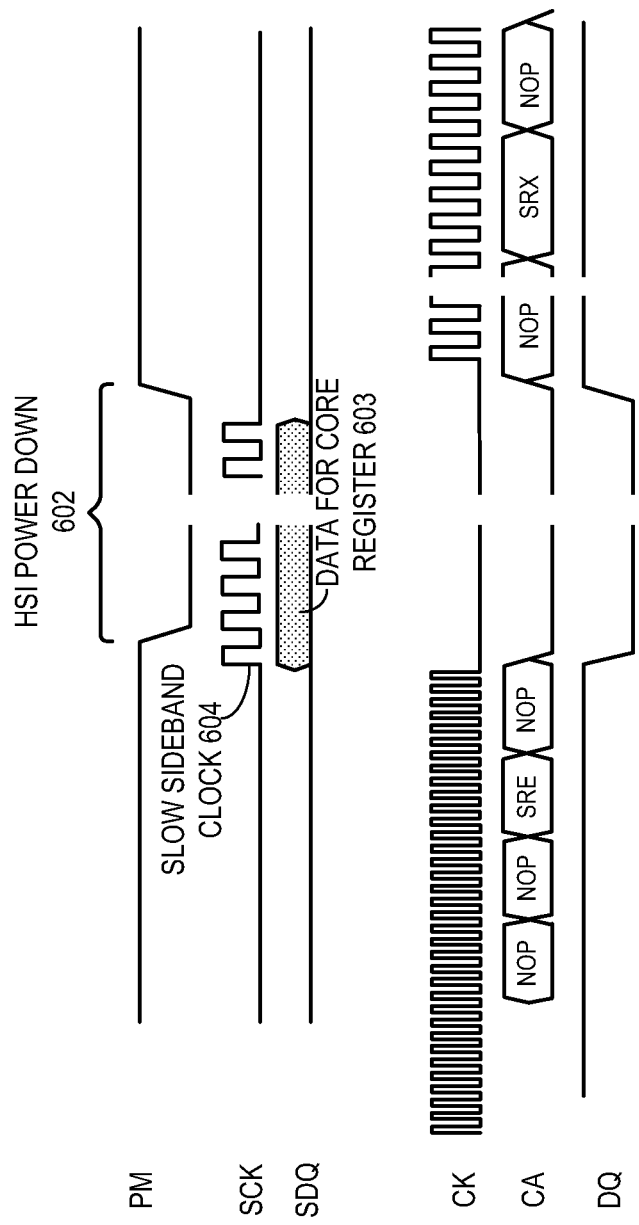
FIG. 6 presents an exemplary timing diagram illustrating the operation of a sideband bus when the HSI is in a low-power mode and the memory core is in a low-power-consumption operational state, in accordance with one embodiment.

FIG. 6 presents an exemplary timing diagram illustrating the operation of a sideband bus when the high-speed interface is in a low-power mode and the memory core is in a low-power-consumption state, in accordance with one embodiment. In this example, the sideband bus is used to carry commands to change the HSI's operating frequency upon the HSI exiting the power-down mode. As shown in FIG. 6, the HSI is powered down during period 602. Prior to the HSI entering the power-down mode, the memory controller issues an SRE command on the CA bus to place the memory core in a low-power self-refresh mode. Meanwhile, the sideband clock (SCK) line carries a slow clock signal 604 to facilitate data transfer on the sideband data (SDQ) bus. The transferred data 603 includes one or more commands and/or parameters necessary to change the HSI clock frequency to a lower value. These commands and/or parameters can be stored in the registers within the memory core.

Subsequently, the memory controller changes the PM signal to a higher level, which places the HSI in the power-up mode. The memory controller now transmits the CK signal at a lower frequency. Since the memory core has already received all the necessary parameters corresponding to the new CK frequency, the memory core can now operate at this new frequency. The memory controller can then transmit an SRX command on the CA bus to bring the memory core out of the low-power self-refresh mode.

In further embodiments, the memory controller can read values from the registers in the memory core via the sideband bus when the memory core is in the low-power self-refresh mode. For example, some registers can store information on the physical state, e.g., temperature, of the memory core. The sideband bus can be used to read the values of these registers, which allows the memory controller to monitor and maintain proper functionality in the memory core.

The above described embodiments may include fewer or additional components. Components may be combined into a single encapsulated package, stacked on top of one-another in the same or different packets and/or the position of one or more components may be changed. In general, a memory controller is a chip that orchestrates the control of data access to and from a memory device, which is an integrated circuit device having an array of memory cells. In some embodiments, the memory controller functionality is included in a processor or other integrated circuit device, for example, a graphics processing unit (GPU), or a mobile applications processor. Thus, there may or may not be a standalone memory controller in the memory system.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII) or Electronic Design Interchange Format (EDIF). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate integrated circuits comprising one or more of the circuits described herein.

While the present disclosure has been described in connection with specific embodiments, the claims are not limited to what is shown. For example, in some embodiments the links between a memory controller and a memory device utilize half-duplex and/or full-duplex communication (e.g., communication on a given link may be in both directions). Similarly, the links between a memory controller and a memory device may operate at a data rate that is: a multiple of the clock frequency such as double data rate (DDR), quad-data rate (QDR), or high multiple data rates.

Moreover, some components are shown directly connected to one another, while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A memory device having a memory core, the memory device comprising:
    input receivers including a first set of receivers and a second set of receivers, the first set of receivers configured to receive commands and the second set of receivers configured to receive data; and
    a register to store a value that indicates whether the second set of receivers are powered down in response to a control signal.

2. The memory device of claim 1, wherein, at a time in which the second set of receivers are powered down, the first set of receivers receive a command.

3. The memory device of claim 1, wherein each input receiver of the input receivers comprises a current source; and
    wherein when a respective receiver is powered down, the current source corresponding to the respective receiver is powered down.

4. The memory device of claim 1, further including transmitters to output data, wherein the register stores information that indicates whether the transmitters are powered down in response to the control signal.

5. The memory device of claim 1,
    wherein while the memory core is in one of a self-refresh state, an idle standby state, and an active standby state, the control signal and a calibration command facilitate calibration of the receivers.

6. The memory device of claim 1, wherein a command received prior to the second set of receivers being powered down indicates an operational state for the second set of receivers after the second set of receivers are powered up.

7. The memory device of claim 6, wherein the command indicates a clock frequency for the second set of receivers after the second set of receivers are powered up.

8. The memory device of claim 1, further comprising an interface which remains operational while the second set of receivers are powered down, and wherein the interface facilitates reading from registers in the memory device when the second set of receivers are powered down.

9. A method of operating a memory device having a memory core, the method comprising:
    receiving commands and data via a number of input receivers, the input receivers including a first set of receivers that receive the commands and a second set of receivers that receive the data; and
    storing a value in a register, the value indicating whether the second set of receivers are powered down in response to a control signal.

10. The method of claim 9, wherein at a time in which the second set of receivers are powered down, the method further comprises receiving a command via the first set of receivers.

11. The method of claim 9, wherein each input receiver of the input receivers comprises a current source; and
    wherein when a respective receiver is powered down, the method further comprises powering down the current source corresponding to the respective receiver.

12. The method of claim 9, wherein the memory device includes transmitters to output data; and wherein the method comprises storing in the register information that indicates whether the transmitters are powered down in response to the control signal.

13. The method of claim 12, wherein when a respective transmitter of the transmitters is powered down, the method further comprises powering down a current source associated with the respective transmitter.

* * * * *